United States Patent
Chainer et al.

(10) Patent No.: US 9,894,811 B2
(45) Date of Patent: *Feb. 13, 2018

(54) PROVISIONING COOLING ELEMENTS FOR CHILLERLESS DATA CENTERS

(71) Applicant: INTERNATIONAL BUSINESS MACHINES CORPORATION, Armonk, NY (US)

(72) Inventors: Timothy J. Chainer, Putnam Valley, NY (US); Pritish R. Parida, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/353,245

(22) Filed: Nov. 16, 2016

(65) Prior Publication Data
US 2017/0071078 A1 Mar. 9, 2017

Related U.S. Application Data

(63) Continuation of application No. 13/439,433, filed on Apr. 4, 2012, now Pat. No. 9,521,787.

(51) Int. Cl.
*H05K 7/20* (2006.01)
*G06F 1/20* (2006.01)
*G06F 1/32* (2006.01)

(52) U.S. Cl.
CPC ......... *H05K 7/20836* (2013.01); *G06F 1/206* (2013.01); *G06F 1/3287* (2013.01);
(Continued)

(58) Field of Classification Search
CPC .. H05K 7/20836; G06F 1/206; Y02B 60/1275
(Continued)

(56) References Cited

U.S. PATENT DOCUMENTS 6,574,104 B2   6/2003 Patel et al.
6,862,179 B2   3/2005 Beitelmal
(Continued)

FOREIGN PATENT DOCUMENTS

CN   101442893 A   5/2009
CN   102016748 A   4/2011
(Continued)

OTHER PUBLICATIONS

Chainer, T., et al. "International Search Report and Written Opinion" Patent Cooperation Treaty. Issued for International Application No. PCT/US2013/034958 dated Jun. 28, 2013. (17 Pages).
(Continued)

*Primary Examiner* — Jianying Atkisson
*Assistant Examiner* — Joel Attey
(74) *Attorney, Agent, or Firm* — Tutunjian & Bitetto, P.C.; Daniel P. Morris

(57) ABSTRACT

Systems and methods for cooling include one or more computing structure, an inter-structure liquid cooling system that includes valves configured to selectively provide liquid coolant to the one or more computing structures; a heat rejection system that includes one or more heat rejection units configured to cool liquid coolant; and one or more liquid-to-liquid heat exchangers that include valves configured to selectively transfer heat from liquid coolant in the inter-structure liquid cooling system to liquid coolant in the heat rejection system. Each computing structure further includes one or more liquid-cooled servers; and an intra-structure liquid cooling system that has valves configured to selectively provide liquid coolant to the one or more liquid-cooled servers.

5 Claims, 11 Drawing Sheets

(52) U.S. Cl.
CPC ....... *H05K 7/2079* (2013.01); *H05K 7/20263* (2013.01); *H05K 7/20272* (2013.01); *H05K 7/20763* (2013.01); *H05K 7/20772* (2013.01); *G06F 2200/201* (2013.01); *Y02B 60/1275* (2013.01); *Y02B 60/1282* (2013.01)

(58) Field of Classification Search
USPC ................. 62/132, 201, 259.2; 361/688, 699
See application file for complete search history.

(56) References Cited

U.S. PATENT DOCUMENTS

| | | | |
|---|---|---|---|
| 7,373,268 | B1 | 5/2008 | Viredaz et al. |
| 7,630,795 | B2 | 12/2009 | Campbell et al. |
| 7,757,506 | B2 | 7/2010 | Ellsworth, Jr. et al. |
| 2003/0193777 | A1 | 10/2003 | Friedrich et al. |
| 2007/0005191 | A1* | 1/2007 | Sloup ............... G05B 17/02 700/276 |
| 2007/0213881 | A1 | 9/2007 | Belady et al. |
| 2009/0259343 | A1 | 10/2009 | Rasmussen et al. |
| 2010/0032142 | A1 | 2/2010 | Copeland et al. |
| 2010/0057259 | A1 | 3/2010 | Dawson et al. |
| 2011/0055605 | A1 | 3/2011 | Jackson |
| 2011/0112694 | A1* | 5/2011 | Bash ................ F24F 11/0001 700/277 |
| 2011/0151765 | A1 | 6/2011 | Chen et al. |
| 2011/0256822 | A1 | 10/2011 | Carlson |

FOREIGN PATENT DOCUMENTS

| | | |
|---|---|---|
| CN | 102077032 A | 5/2011 |
| CN | 102478790 A | 5/2012 |
| TW | 201122782 A1 | 7/2011 |
| WO | 2010002388 | 1/2010 |

OTHER PUBLICATIONS

Chen, Y., et al, "Managing Server Energy and Operational Costs in Hosting Centers" Proceedings of the 2005 ACM SIGMETRICS International Conference on Measurement and Modeling of Computer Systems. Jun. 2005. pp. 303-314.

Harrington, S., "Optimal Heat Transfer for Liquid Cooling With Minimal Coolant Volume" 27th Annual IEEE Semiconductor Thermal Measurement and Management Symposium, Mar. 2011. (5 pages).

Huang, W., et al. "TAPO: Thermal-Aware Power Optimization Techniques for Servers and Data Centers" Green Computing Conference and Workshops (IGCC), Jul. 2011. (8 Pages).

Pakbaznia, E., et al. "Temperature-Aware Dynamic Resources Provisioning in a Power-Optimized Datacenter" Design, Automation and Test in Europe Conference and Exhibition, Mar. 2010. (6 Pages).

* cited by examiner

PROVISIONING COOLING ELEMENTS FOR CHILLERLESS DATA CENTERS

GOVERNMENT RIGHTS

This invention was made with Government support under Contract No.: DE-EE0002894 (Department of Energy). The government has certain rights in this invention.

RELATED APPLICATION INFORMATION

This application is related to Issued Patent No. 9,250,636 entitled "COOLANT AND AMBIENT TEMPERATURE CONTROL FOR CHILLERLESS LIQUID COOLED DATA CENTERS," issued on Feb. 2, 2016, which is incorporated herein by reference.

BACKGROUND

Technical Field

The present invention relates to data center design and, more particularly to energy-efficient cooling systems in large data centers.

Description of the Related Art

Data centers are facilities that house numerous computer systems arranged in the form of electronics racks. Typically, a data center houses on the order thousands of electronic racks. Each computer system in a rack may include one or more processors, memory devices, controllers, power converters and manipulators, and other such electronic components. Depending upon the state of operation, a computer system may dissipate on the order of hundreds of Watts to thousands of Watts. Therefore, a significant amount of cooling is used to keep the electronic components within an optimum operating temperature range. Server driven power usage amounts to a significant portion of total US energy consumption. Liquid cooling solutions, which may include transferring 100% of the heat dissipated by the rack(s) to water, eliminating the facility air conditioning units, use of building chilled water to cool the racks, use of energy efficient chillers to provide relatively lower temperature coolants to the rack(s), and many other liquid cooling solutions, have been proposed as a means to reduce data center cooling/total power consumption. However, such solutions are far from optimal in their cooling energy efficiency.

SUMMARY

A system for cooling includes one or more computing structure; an inter-structure liquid cooling system comprising valves configured to selectively provide liquid coolant to the one or more computing structures; a heat rejection system comprising one or more heat rejection units configured to cool liquid coolant; and one or more liquid-to-liquid heat exchangers comprising valves configured to selectively transfer heat from liquid coolant in the inter-structure liquid cooling system to liquid coolant in the heat rejection system. The one or more computing structures each include one or more liquid-cooled servers; and an intra-structure liquid cooling system comprising valves configured to selectively provide liquid coolant to the one or more liquid-cooled servers.

A system for cooling includes one or more computing structures; an inter-structure liquid cooling system comprising valves configured to selectively provide liquid coolant to the one or more structures; a heat rejection system comprising one or more heat rejection units configured to cool liquid coolant; and one or more liquid-to-liquid heat exchangers configured to transfer heat from liquid coolant in the inter-structure liquid cooling system to liquid coolant in the heat rejection system. The one or more computing structures each include one or more liquid- and air-cooled servers; an intra-structure liquid cooling system comprising valves configured to selectively provide liquid coolant to the one or more liquid-cooled servers; and at least one air-to-liquid heat exchanger for each server, coupled to the intra-structure cooling system and configured to selectively provide low-temperature air to each server.

A method for cooling includes providing coolant to one or more computing structures in proportion to a number of operating servers in the computing structure; monitoring a coolant temperature before the coolant has entered one or more computing structures; decreasing cooling to one or more of the computing structures if the coolant temperature falls below a first threshold by disengaging one or more heat exchangers; and increasing cooling to one or more of the computing structures if the coolant temperature exceeds a second threshold by engaging one or more heat exchangers.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

The present principles provide a set of hardware tools and control methods for data centers that can be implemented to optimize data center cooling power consumption. Toward this end, a multi-level distributed cooling control is shown which adjusts cooling at the server level (cooling distribution inside each server), at an intra-rack level (cooling distribution manifolds inside each rack), at an inter-rack level (regulating the flow going to each rack), and an external level (adjusting a duty cycle for outside heat exchangers).

At the inter-rack level, one or more racks are arranged in, e.g., a data center, having a liquid cooling system to transfer generated heat to one or more heat rejecters. At the inter-rack level, tuning is available to increase cooling efficiency by taking into account outside weather conditions, by considering the workload of individual racks, and by adjusting coolant flow between the racks and the heat rejecters accordingly.

At the intra-rack level, one or more computing devices (e.g., servers) have a liquid cooling system and, optionally, an air cooling system, to transfer generated heat out of the rack. Intra-rack tuning is available to increase cooling efficiency by monitoring internal temperature conditions and adjusting the workload of and cooling to individual servers.

At the server level, a combination of liquid- and air-cooled components may be present. The liquid-cooled components may have their cooling adjusted, or even turned off entirely, according to whether the component is active. Air cooling within the server may also be adjusted by adjusting coolant flow to an air-to-liquid heat exchanger, allowing for fine-grained control of heat load transfer into the air and into the liquid coolant within the server.

Figure 1:
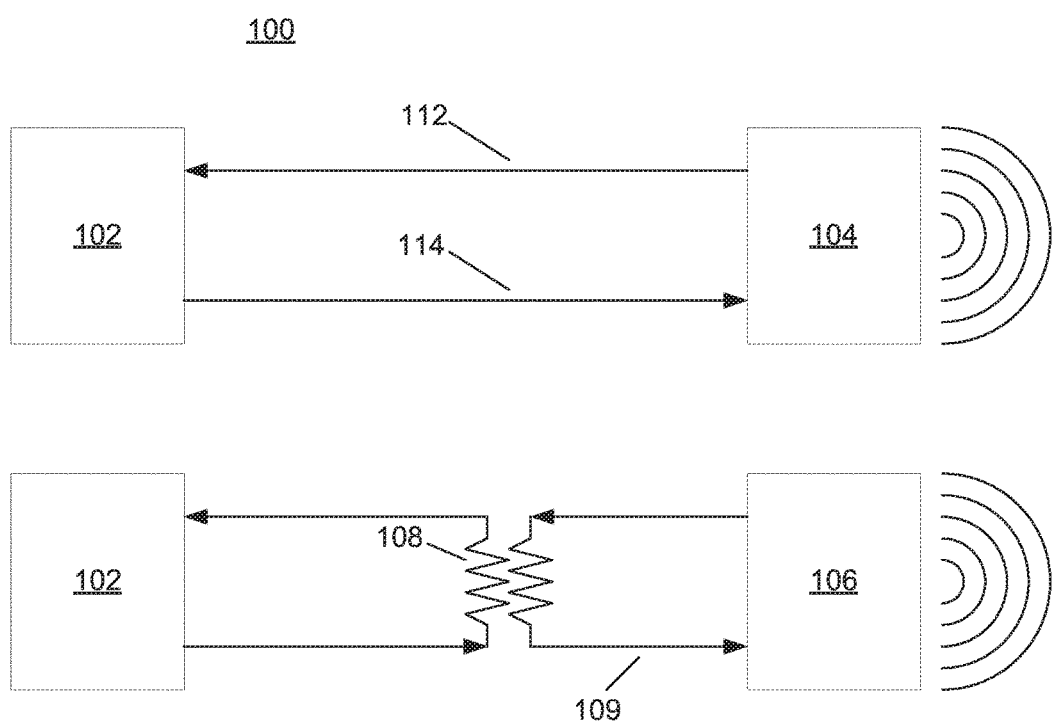
FIG. 1 is a diagram of single-loop and double-loop cooling systems.

Referring now to the drawings in which like numerals represent the same or similar elements and initially to FIG. 1, an exemplary data center cooling system 100 is shown. The data center includes a number of racks 102, which circulate coolant. Low-temperature coolant 112 enters the racks 102, picks up heat, and leaves the racks 102 as high-temperature coolant 114. Although the present invention is described herein with respect to racks of servers, it is contemplated that any appropriate structure could be employed. In particular, any clustering, grouping, or other organization of computing devices or structures could be cooled using the present principles.

FIG. 1 shows a system that has both liquid-to-air heat exchangers 104 and liquid-to-liquid heat exchangers (LLHx) 108 In a liquid-to-air cooling arrangement, high-temperature coolant 114 passes directly to an air-side outdoor exchanger 104, for example a set of cooling fins. Any appropriate type of heat exchange may be used in place of the liquid-to-air exchanger 104, including dry coolers, a building's chilled water supply, a cooling tower, a wet cooler, a building's heating or heat recovery systems, a geothermal loop, or a combination of multiple kinds. In a liquid-to-liquid cooling arrangement, high-temperature coolant 114 passes through a paired cooling coil. A heat exchanger 106 has a separate coolant circulation system that also feeds into the paired cooling coil of LLHx 108. The coolant from the heat exchanger 106 reduces the temperature of the high-temperature coolant 114 without mixing, before dissipating its heat at heat exchanger 106. The LLHxes 108 may be optionally turned off by shutting off the flow of coolant through the paired cooling coil. Additionally, multiple LLHxes 108 may be arranged along a single double-loop line, such that external heat dissipation may be controlled by enabling an appropriate number of heat exchangers 108.

The rate of heat transfer at the rack(s) 102 is predominantly governed by the liquid coolant flow rate through them. At the outdoor heat exchangers 104 and 106, the heat transfer rate is governed by the outdoor heat exchanger's air-side flow rate and the liquid coolant flow rate through the outdoor heat exchanger 104. The heat transfer rate is a non-linear monotonically increasing function of air-side flow rate and liquid coolant flow rate. For any given heat exchanger design, there is a limit to the air-side flow rate and liquid flow rate. These limits are used to guide the heat exchanger selection so as to meet the maximum cooling requirements (the worst case scenario) by a safe margin. "Worst case scenario" here refers to the highest ambient air temperature and highest heat dissipation expected at the rack(s), and in a more general sense, highest heat dissipation at the data center, occurring simultaneously. The "worst case scenario" should be rare and might not even occur over the entire life cycle of the data center.

In some more common situations, an electronic rack 102 might be partially filled. Moreover, with data center provisioning (for example, powering off servers whose resources are not being used, etc.) being widely used to reduce the IT power usage, powered-off servers within a rack 102 might also be cooled, even those servers which would not generate heat. These situations may result in more cooling power consumption than is needed for almost the entire life cycle of data center. Hence, liquid cooling distribution hardware and controls based on physical infrastructure and environmental conditions both inside and outside the data center, may be used to properly optimize the cooling power consumption and further reduce the data center energy usage.

Figure 2:
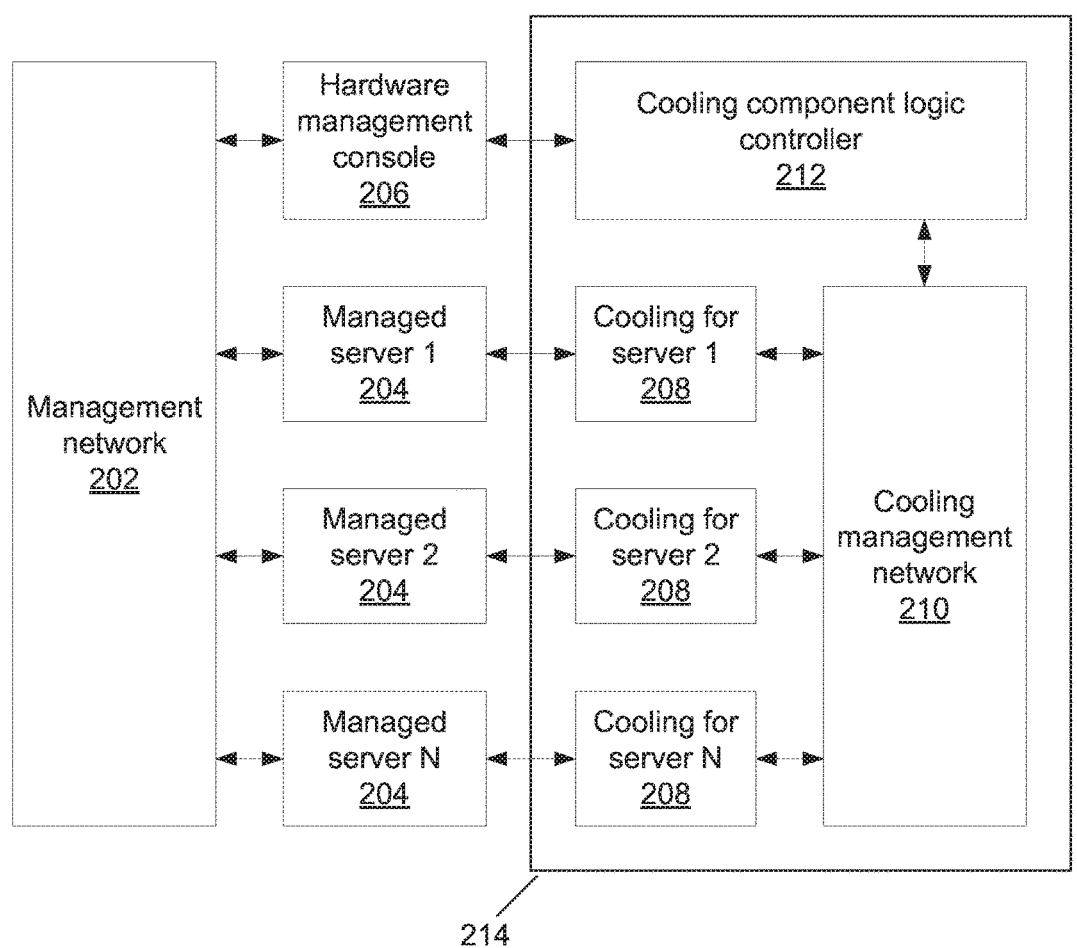
FIG. 2 is a diagram of an exemplary intra-rack cooling system according to the present principles.

Referring now to FIG. 2, a system for managed cooling of servers at an intra-rack level is shown. A plurality of managed servers 204 are shown, connected to a hardware management console (HMC) 206 by a management network 202. The HMC 206 controls workload implementation in the servers 204 and may include, e.g., one or more hypervisor nodes. Each managed server 204 has a corresponding cooling unit 208, and the cooling units 208 are controlled by a cooling component logic controller 212 through a cooling management network 210. Together, the cooling components and controls form cooling system 214. The logic controller 212 receives information about outdoor ambient conditions, such as temperature information. Because outdoor temperature is related to cooling efficiency, the logic controller 212 can use that information to control factors such as coolant flow rate.

The present principles reduce cooling power consumption by providing liquid cooling only to the components that require cooling. For example, if a managed server 204 is in off-state, then this status information can be fed to the cooling logic controller 212, which would then take steps to close the coolant flow to that server 204 without affecting the coolant flow to any other server. To take another example, if the managed server 204 needs to be powered ON, then this information can also be fed to the cooling logic controller 212 so that cooling to the server 204 can be activated. Cooling can furthermore be tuned to particular levels corresponding to the workload at a server 204, with higher workloads allocating more cooling. This system applies to the inter-rack level as naturally as to the intra-rack level. In one exemplary embodiment, a set of 1U servers 204 may be installed in a rack 102, with liquid cooling 208 being provided in parallel to each server. Cooling 208 may include a coolant line to each server 204 that may have a control valve to control or turn off the flow rate of coolant to the server 208 as directed by cooling logic controller 212.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 3:
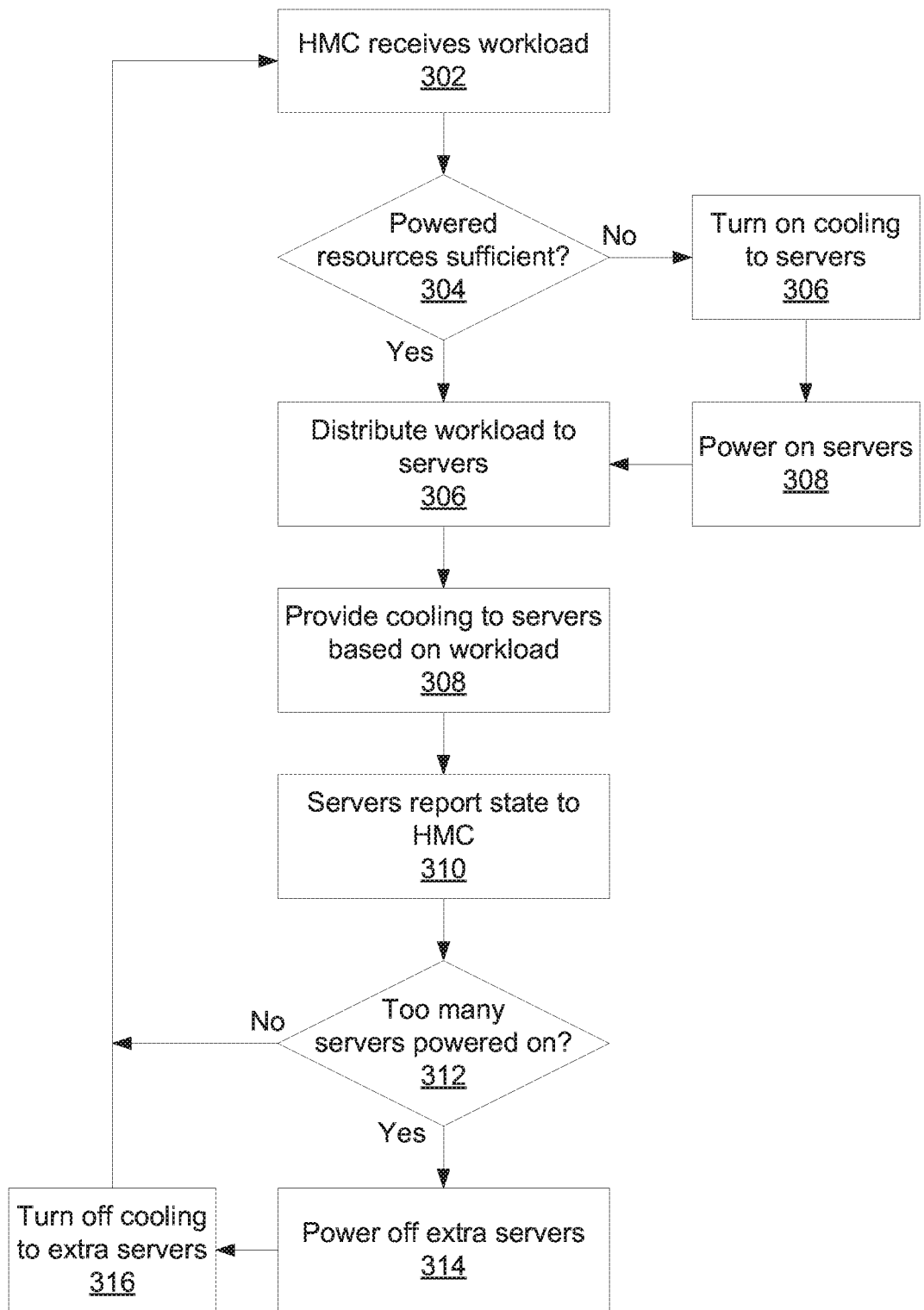
FIG. 3 is a block/flow diagram of a method for tuning intra-rack cooling according to the present principles.

Referring now to FIG. 3, an exemplary method for provisioning cooling is provided. At block 302 the HMC 206 receives a workload. The HMC 206 evaluates the amount of resources needed to run the workload and determines whether the servers 204 currently powered on are sufficient to meet the workload's needs at block 304. These resources may include processors, memory, storage space, etc. If not, HMC 206 sends information to cooling logic controller 212, which activates cooling for additional servers 204 at block 306. After allowing time for cooling to become effective at the new servers 204, HMC 206 turns the new servers 204 on at block 308—the workload may be held in a queue at HMC 206 in the meantime.

Once there are enough resources available, HMC 206 distributes the workload to servers 204 at block 306. The HMC 206 communicates this information to cooling logic controller 212 at block 308, which provides cooling to the workload proportionate to the expected workload intensity. During the workload's processing, or at the completion of the workload, the servers 204 report their status to HMC 206 at block 310. At block 312, HMC 206 determines whether there are too many servers 204 powered on, for example if the number of resources available exceeds a required amount by a certain threshold or percentage. If so, HMC 206 powers off extra servers 204 at block 314, and cooling logic controller 212 turns off cooling to those servers at block 316. Processing may return to block 302. This loop may be run many times concurrently if multiple workloads are being performed in parallel, allowing servers 204 to be added or removed to meet real-time demand fluctuations.

Figure 4:
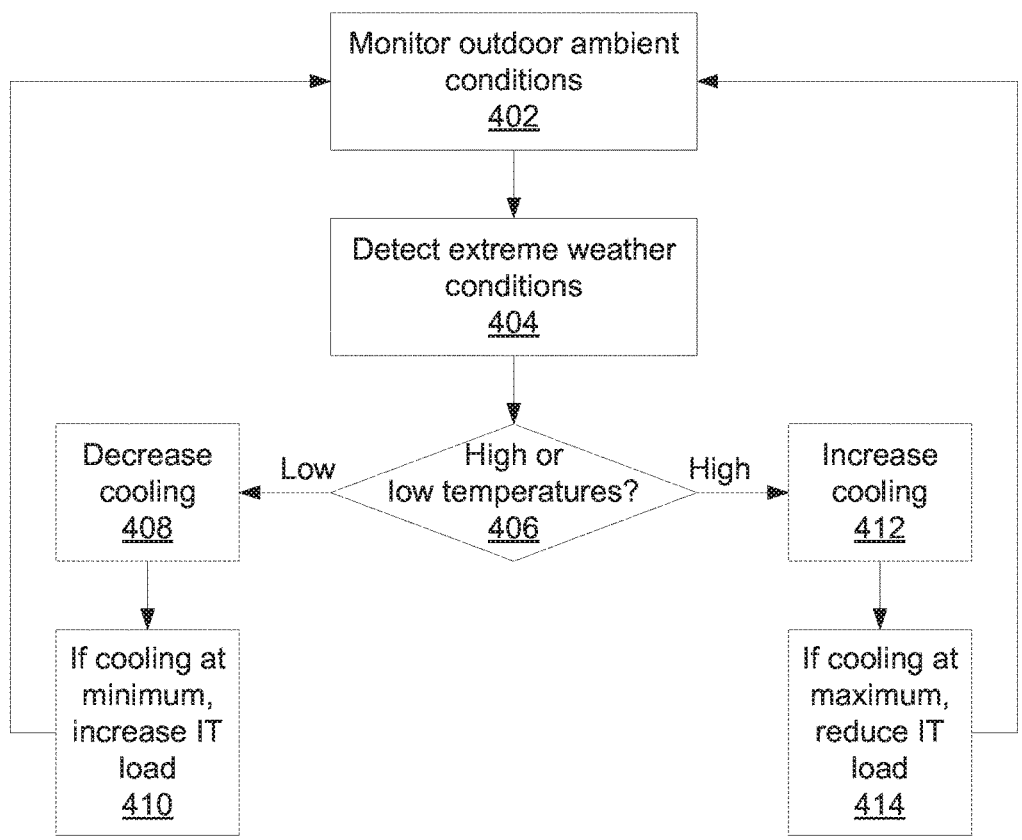
FIG. 4 is a block/flow diagram of a method for tuning cooling in response to ambient weather conditions according to the present principles.

Referring now to FIG. 4, provisioning based on outdoor conditions is shown. Cooling logic controller 212 monitors ambient conditions using one or more sensors or other inputs at block 402. When an extreme weather condition is detected at block 404, the controller 212 determines whether the extreme condition represents high temperatures or low temperatures at block 406. If temperatures are particularly low, the controller 212 decreases cooling at block 408. If cooling has reached a minimum, controller 212 communicates with HMC 206 to increase an information technology (IT) load by, e.g., increasing the workload, turning on servers, etc., at block 410. This helps prevent condensation from forming, a condition which may occur if temperatures dip below the dew point and which may damage equipment. If the detected extreme weather condition is one of high temperatures, the controller 212 increases cooling at block 412. If cooling is already at a maximum, the controller 212 communicates with HMC 206 to reduce the IT load at block 414. Once appropriate measures have been taken, monitoring continues at block 402. Other weather conditions may influence cooling efficiency and may therefore influence this process. For example, it is contemplated that outside humidity and precipitation may also be considered, as these may also affect cooling efficiency. It is therefore contemplated that any relevant weather condition may be accounted for by increasing or decreasing cooling as appropriate.

As the IT load is increased or decreased in blocks 410 and 414, workloads may be shifted between servers 204 to consolidate running servers into racks, such that cooling may be enabled or disabled for entire racks as needed.

Figure 5:
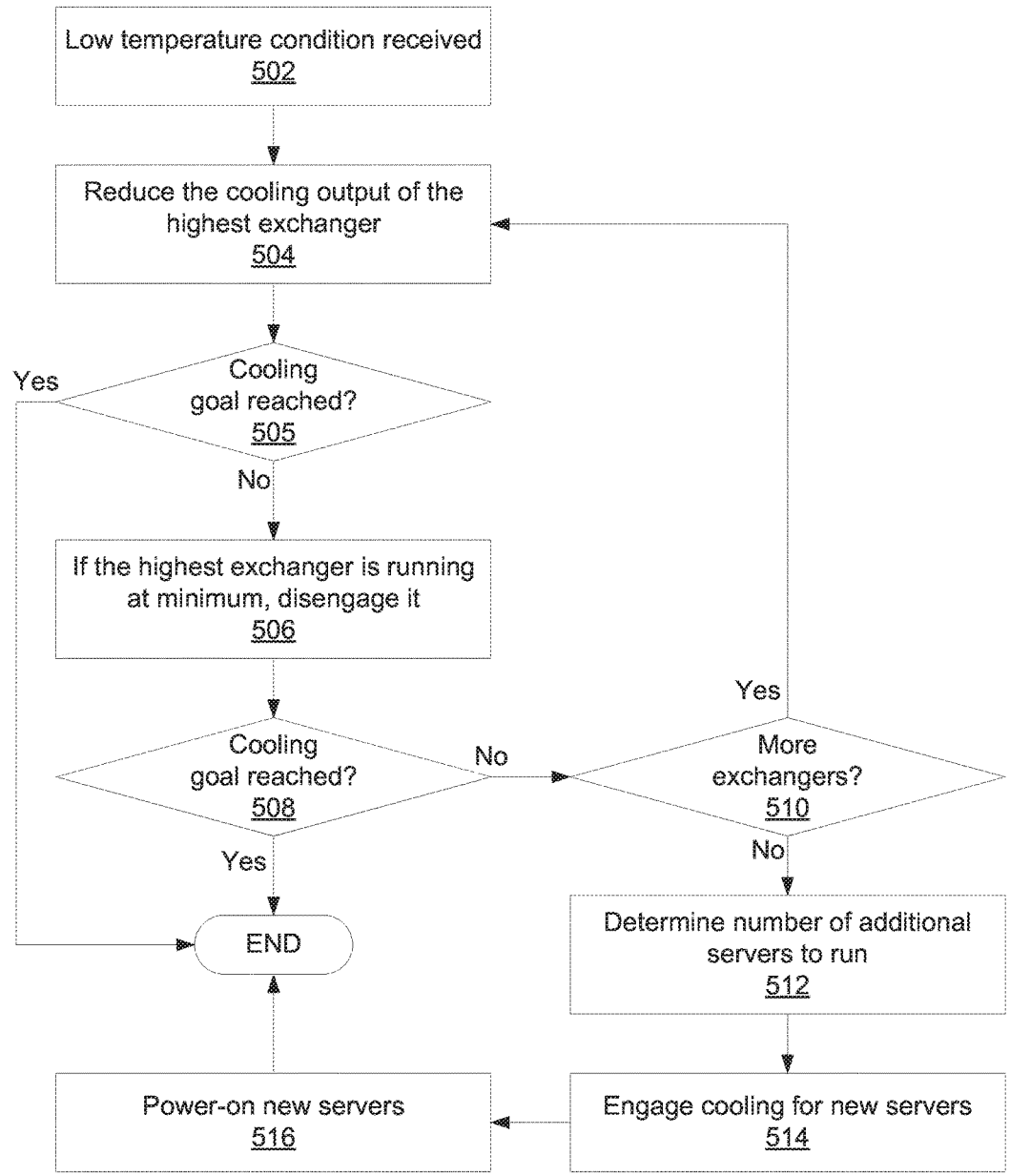
FIG. 5 is a block/flow diagram of a method for tuning cooling in response to low temperature conditions according to the present principles.

Referring now to FIG. 5, detail on blocks 408 and 410 is shown for decreasing cooling in response to low-temperature conditions. At block 502, the cooling controller 212 receives a low-temperature condition. The controller 212 begins at a highest-indexed cooling unit 208. The cooling units 208 may be ordered in any appropriate fashion according to the data center layout and design, such that cooling is reduced in an even manner across the data center. It is specifically contemplated that cooling units 208 may include LLHxes 108, though any appropriate selectively enabled heat exchanger could be substituted.

At block 504, the controller reduces the cooling output of the highest-indexed heat exchanger 208. At block 505 it is determined whether the cooling goal has been reached. If so, processing ends. If not, and the highest-indexed exchanger 208 is running at a minimum, the exchanger 208 is disengaged at block 506. Block 508 checks again whether the cooling goal has been reached. If so, processing ends, if not, and if there are more exchangers running at block 510, processing returns to block 504 with the next heat exchanger 208 selected.

If there is still too much cooling, and all of the heat exchangers 208 are disengaged, the logic controller 212 communicates with HMC 206 to direct the HMC 206 to increase IT load. HMC 206 determines a number of additional resources to bring online, e.g., additional servers, at block 512. The HMC 206 directs cooling controller 212 to engage sufficient cooling for the new servers if necessary at block 514 and then turns on the new servers at block 516. Having introduced heat sources sufficient to, e.g., prevent condensation, processing ends.

Figure 6:
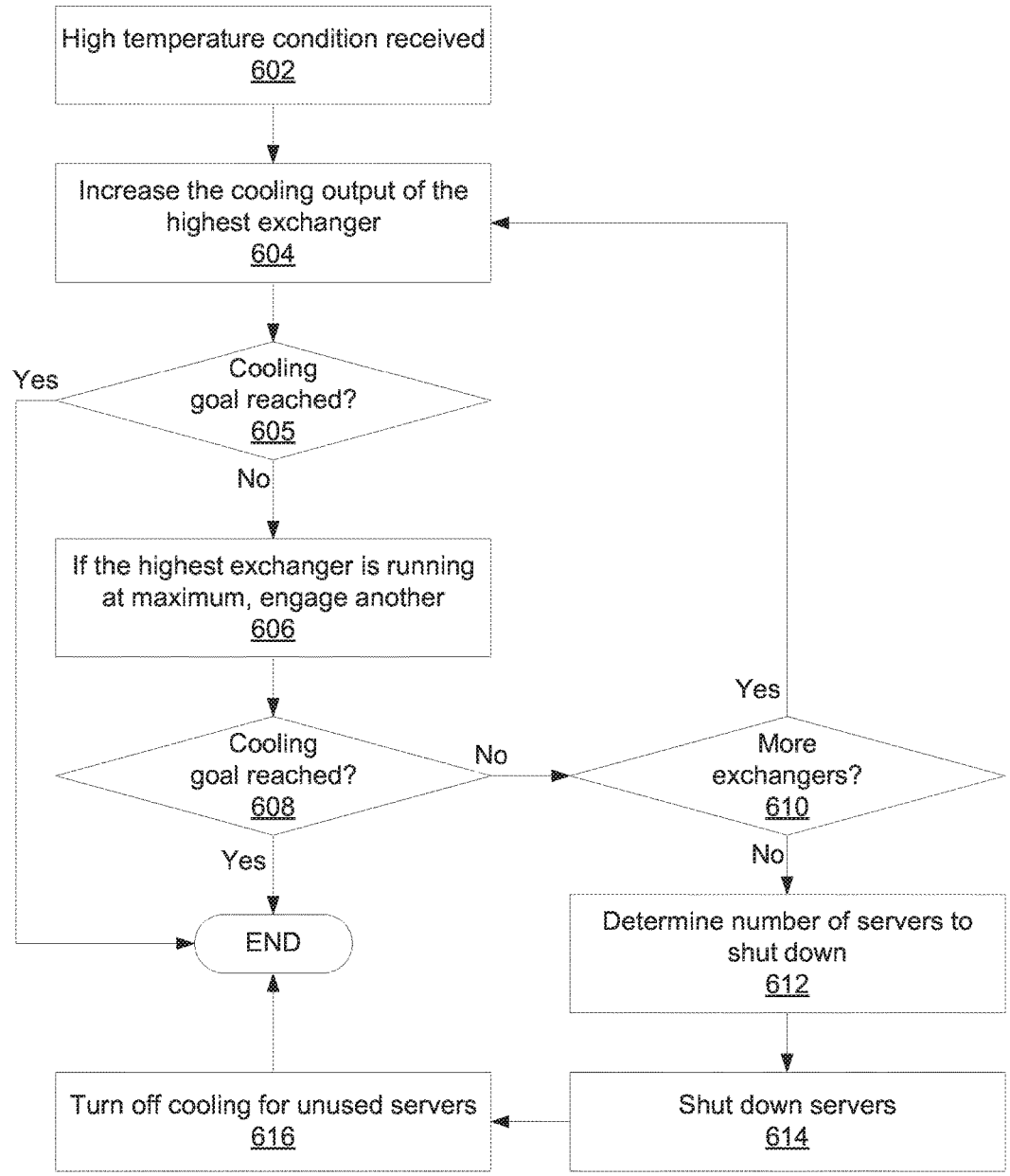
FIG. 6 is a block/flow diagram of a method for tuning cooling in response to high temperature conditions according to the present principles.

Referring now to FIG. 6, detail on blocks 412 and 414 is shown for increasing cooling in response to high-temperature conditions. At block 602, the cooling controller 212 receives a high-temperature condition. The controller 212 begins at a highest-indexed cooling unit 208. As above, the cooling units 208 may be ordered in any appropriate fashion according to the data center layout and design, such that cooling is increased in an even manner across the data center. At block 604, the controller increases the cooling output of the highest-indexed heat exchanger 208. At block 605 it is determined whether the cooling goal has been reached. If so, processing ends. If not, and the highest-indexed exchanger 208 is running at a maximum, a new exchanger 208 is engaged at block 606. Block 608 checks again whether the cooling goal has been reached. If so, processing ends, if not, and if there are more exchangers 208 idle at block 610, processing returns to block 604 with the next heat exchanger 208 selected.

If there is still too much cooling, and all of the heat exchangers 208 are engaged, the logic controller 212 communicates with HMC 206 to direct the HMC 206 to decrease IT load. HMC 206 determines a number of resources to bring to shut down to make the heat output manageable at block 612. At block 614, the HMC 206 shuts down the determined number of resources, e.g., servers 204, after saving the state of those resources—the resource's function can be resumed at a later time when other resources become available or when the extreme weather condition has passed. After a short wait, cooling controller 212 shuts off cooling for the now-unpowered servers.

Figure 7:
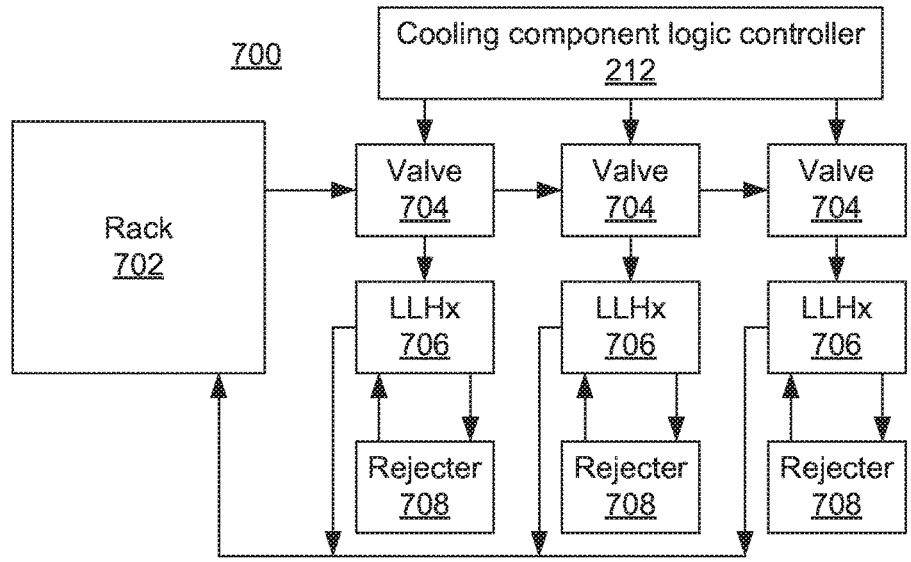
FIG. 7 is a diagram of a cooling system that includes a plurality of different heat rejecters according to the present principles.

Referring now to FIG. 7, a first liquid coolant distribution control system 700 is shown. One or more racks 702 generate heat, warming coolant that flows through them. The coolant passes to a chain of valves 704, each of which may be selectively engaged or disengaged by, e.g., cooling controller 212. Each valve 704 controls coolant flow to a LLHx 706. Each LLHx 706 is thermally coupled to a heat rejection unit 708, which takes warm coolant from the LLHx 706 and dissipates heat by any appropriate mechanism. The LLHx accepts warm coolant from the valve 704, cools that fluid, and returns coolant to the rack 702 to be reused.

The heat rejection units 708 may include, for example, dry coolers, wet coolers, building chilled water, cooling towers, building heat recovery units, geothermal loops, etc. Each of these types of heat rejection unit 708 has different properties, making each one more advantageous for use in different circumstances. For example, when outdoor ambient air temperatures are between about 10 and 30 degrees Celsius, a dry cooler might be the most efficient whereas, for temperatures in excess of about 30 degrees Celsius, a wet cooler might be superior. For temperatures below freezing, a geothermal loop could be most effective. The particular parameters of the cooling system 700 and the heat rejection units 708 are considered by cooling controller 212 in conjunction with sensor data on the outdoor weather conditions to determine which valves 704 should be engaged to provide optimal cooling efficiency. As noted above, one such parameter may include an optimal operating range for each heat rejection unit 708.

Figure 8:
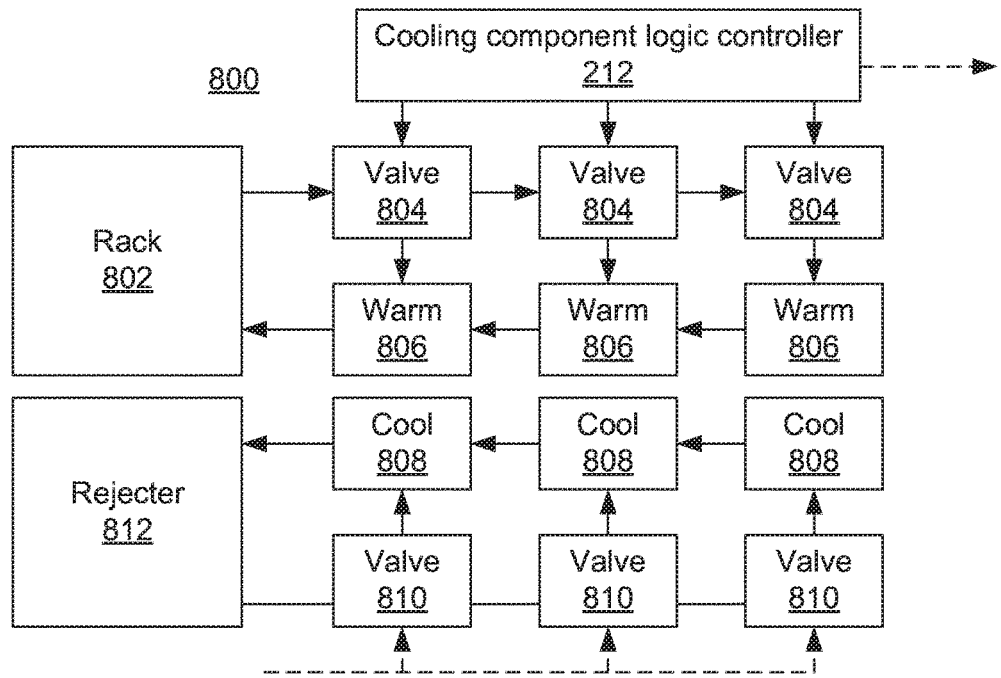
FIG. 8 is a diagram of a cooling system that includes a plurality of liquid-to-liquid heat exchangers and a single heat rejecter according to the present principles.

Referring now to FIG. 8, a second liquid coolant distribution control system 800 is shown. Whereas in FIG. 7, the system 700 had several heat rejection units 708, each served by a separate LLHx 706, the system 800 of FIG. 8 has a single heat rejection unit 812 served by several LLHxes 806/808. Each LLHx is formed from, e.g., a warm element 806 and a cool element 808. These elements may be, for example, brazed-plate heat exchangers or coils of copper tube or any other appropriate material or shape. Coolant leaves rack 802 and passes to a chain of valves 804, each of which may be selectively engaged or disengaged by, e.g., cooling controller 212. Each valve 804 controls coolant flow to a warm element 806. Coolant from heat rejection unit 812 passes through one or more of valves 810 before passing to cool elements 808 and returning to heat rejection unit 812.

The cooling efficiency of a given LLHx will depend on the temperature difference between its warm element 806 and its cool element 808. As such, the rate at which heat can be extracted from the rack 802 will depend on this temperature difference, regardless of the efficiency of the heat rejection unit 812. In order to ensure that sufficient heat is transferred, cooling controller 212 may engage valves 804 and 810 to send coolant through additional warm and cool elements 806 and 808.

Figure 9:
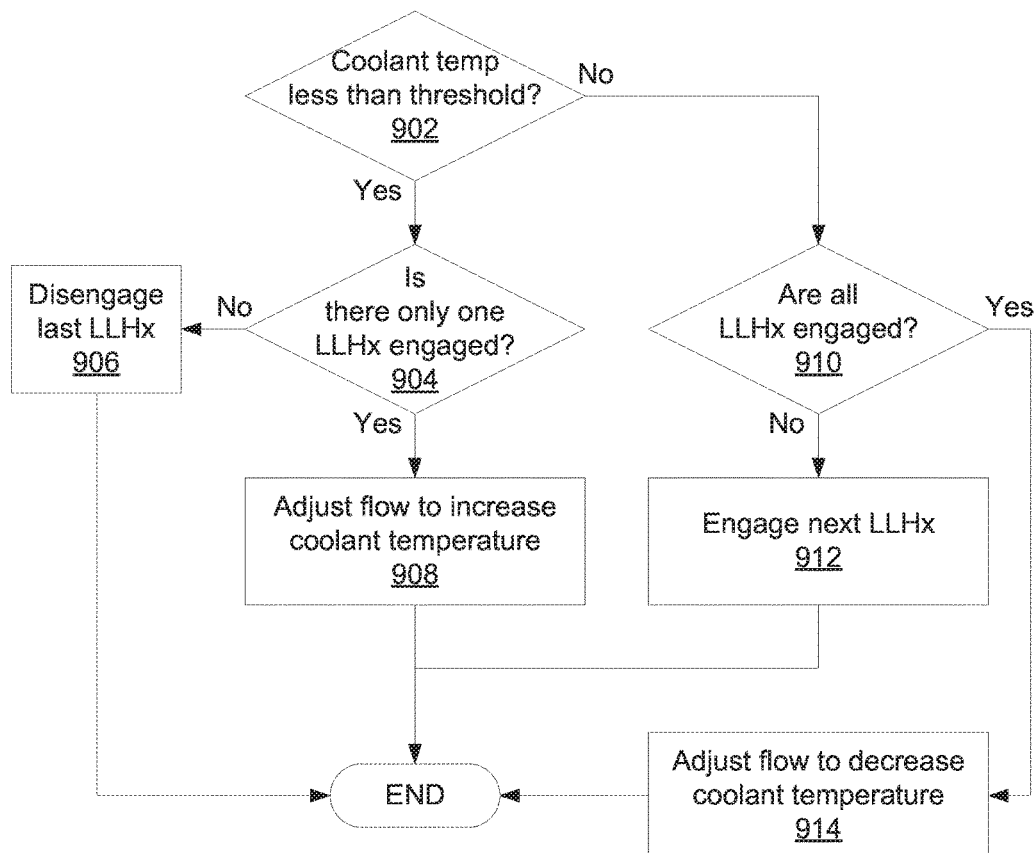
FIG. 9 is a block/flow diagram of a method for tuning cooling by controlling coolant flow to heat rejecters according to the present principles.

Referring now to FIG. 9, a block/flow diagram of control logic for the cooling system 800 of FIG. 8 is shown. Block 902 begins by determining whether the coolant temperature is above or below a desired threshold temperature. The coolant temperature may be measured at any point in the system, including before entering the rack and after leaving the rack. If the temperature is below the threshold, block 904 checks whether there is only one LLHx 806/808 engaged. If not, block 906 disengages the last LLHx 806/808 in the chain by sending a signal to the valves 804 and 810 associated with the LLHx 806/808, instructing those valves 804 and 810 to close. If there was only one LLHx 806/808 engaged at block 904, then block 908 adjusts the coolant flow to increase the coolant temperature that returns to the rack 802. This may be desirable to prevent condensation within the rack 802.

If the coolant temperature is greater than the desired threshold temperature, block 910 checks whether all of the LLHxes 806/808 are engaged. If not, block 912 engages the next LLHx 806/808 in the chain by sending a signal to valves 804 and 810 associated with the LLHx 806/808, instructing those valves 804 and 806 to open. If all of the LLHxes 806/808 were engaged at block 910, then block 914 adjusts the coolant flow to decrease the coolant temperature that returns to the rack 802.

Figure 10:
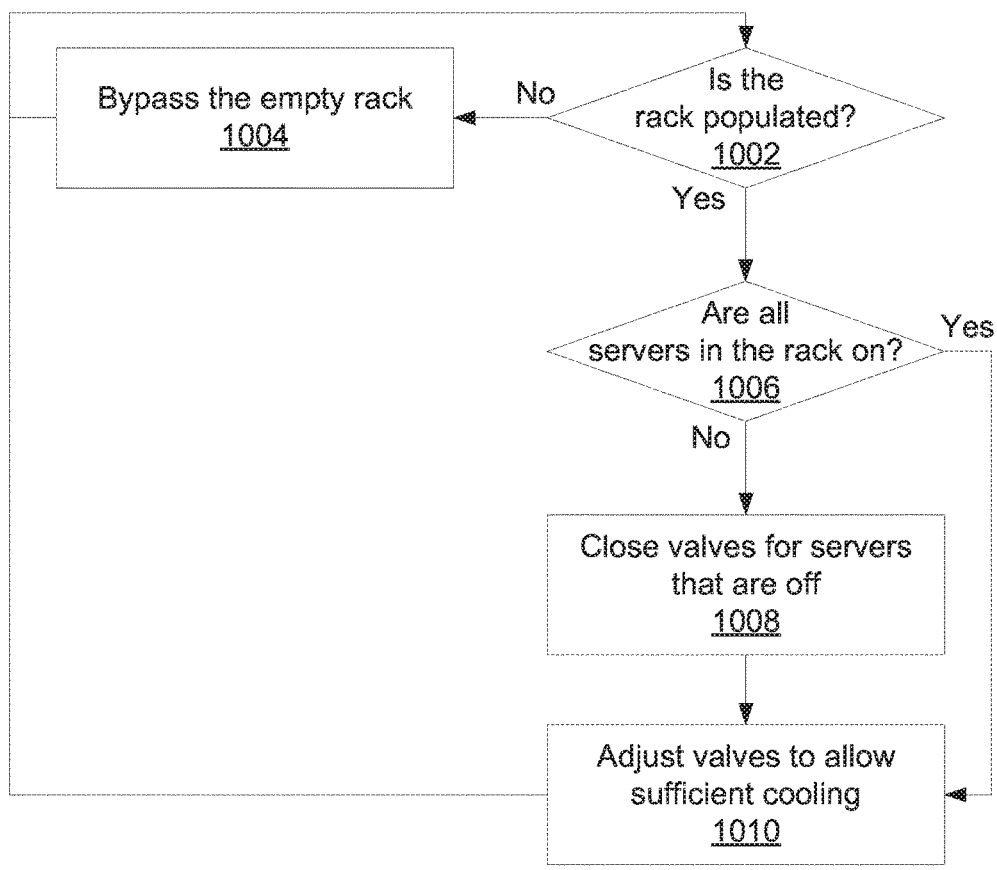
FIG. 10 is a block/flow diagram of a method of tuning inter-rack cooling according to the present principles.

Referring now to FIG. 10, a block/flow diagram of control logic for coolant distribution at the intra-rack level is shown. As shown in FIG. 2, cooling system 214 has control over the cooling for individual servers 204 within a rack 102. The cooling controller 212 checks to see if there are any servers within the rack 102 by communicating with hardware management console 206 at block 1002. If not, the cooling controller 212 bypasses the empty rack at block 1004. If the rack is populated, block 1006 checks whether all of the servers in the rack are turned on. If not, the cooling 208 for the unpowered servers 204 is turned off at block 1008. Cooling is then adjusted to allow sufficient cooling through rack 102 to accommodate the needs of all the powered servers 204.

Figure 11:
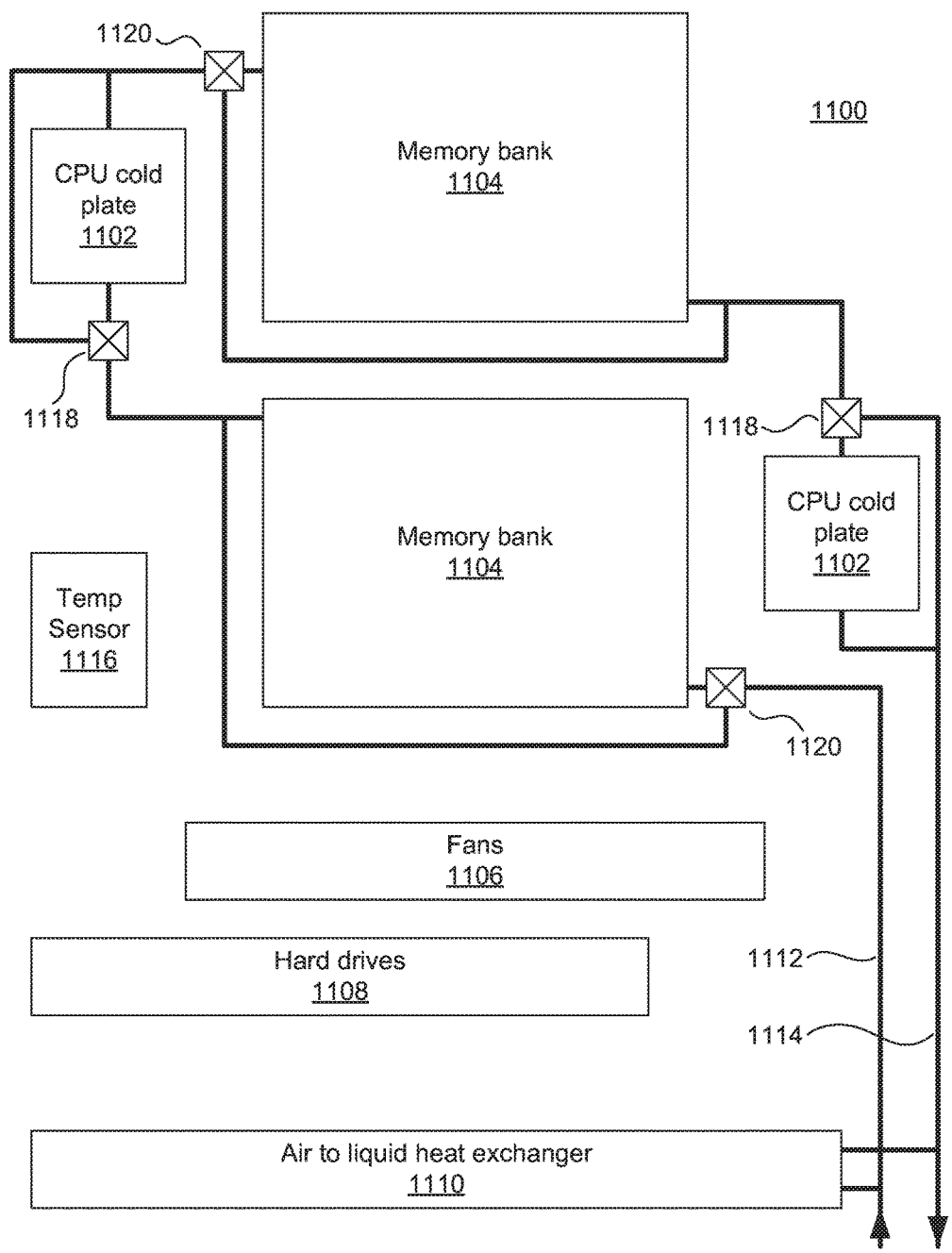
FIG. 11 is a diagram of an intra-server cooling system according to the present principles.

Referring now to FIG. 11, a schematic of an air- and liquid-cooled server 1100 is shown. In addition to liquid-cooled components, such as CPU cold plates 1102 and memory banks 1104, many components in a server 110 may be air-cooled. For example, hard drives 1108 are frequently air-cooled. Additionally, memory banks 1104 may be cooled by a combination of liquid- and air-cooling. Cool coolant liquid 1112 enters the server 1100 from an external cooling system. The coolant 1112 enters memory banks 1104 and CPU cold plates 1102, being warmed in the process and becoming warm coolant liquid 1114 to exit the server 1100.

An air-to-liquid heat exchanger (ALHx) 1110 may be mounted on server 1100 or on a sidecar of a rack 102 and is attached to the coolant lines 1112 and 1114. The ALHx may be connected to the coolant lines in either order, taking either warm coolant 1114 or cool coolant 1112 as its input, depending on desired air temperature. Air circulates within the server 1100 by the fans 1106 and is warmed by, e.g., hard drives 1108 and memory banks 1104. The air exits the server as warm air and is then passed through the ALHx 1110, which cools the air before recirculating it into server 1100. There may be substantial air temperatures within the server 1100, and so multiple ALHxes 1110 may be employed to provide uniform conditions.

As noted above, the ALHx 1110 may be connected to coolant lines 1112 and 1114 in either order, taking either cool coolant or warm coolant as input. In some situations, memory banks 1104 may be liquid cooled as well as air cooled. In this case, part of the heat dissipated by the memory banks 1104 goes into the air, while part of the heat goes into the liquid coolant. This fraction of heat is dependent on the air and liquid temperature that the memory banks 1104 are exposed to. As such, by having warmer air enter the server 1100, heat going in to the air from the memory banks 1104 may be minimized. This increases the efficiency of cooling at the rack level. The ALHx 1110 may also be connected to the coolant lines 1112 and 1114 using valves that allow the coolant flow to be reversed through ALHx 1110, taking either warm coolant or cool coolant as input as circumstances demand.

Liquid cooling at the server level may also be tuned. For example, memory banks 1104 may be partially populated and individual CPUs 1102 may have varying workloads or be shut off entirely. Individual memory slots within banks 1104 may be selectively cooled according to whether those slots are in use, and CPU cold plates 1102 may be adjusted or shut off using valves 1118 according to CPU usage. Cooling for entire memory banks 1104 may be shut off using valves 1120. Cooling within the server 1100 may further be controlled based on direct measurements of ambient temperature using, e.g., temperature sensor 1116. Temperature sensor may be used to provide direct feedback to, e.g., ALHx 1110 as well as to external cooling logic 212, which may in turn tune cooling settings according to desired conditions.

Figure 12:
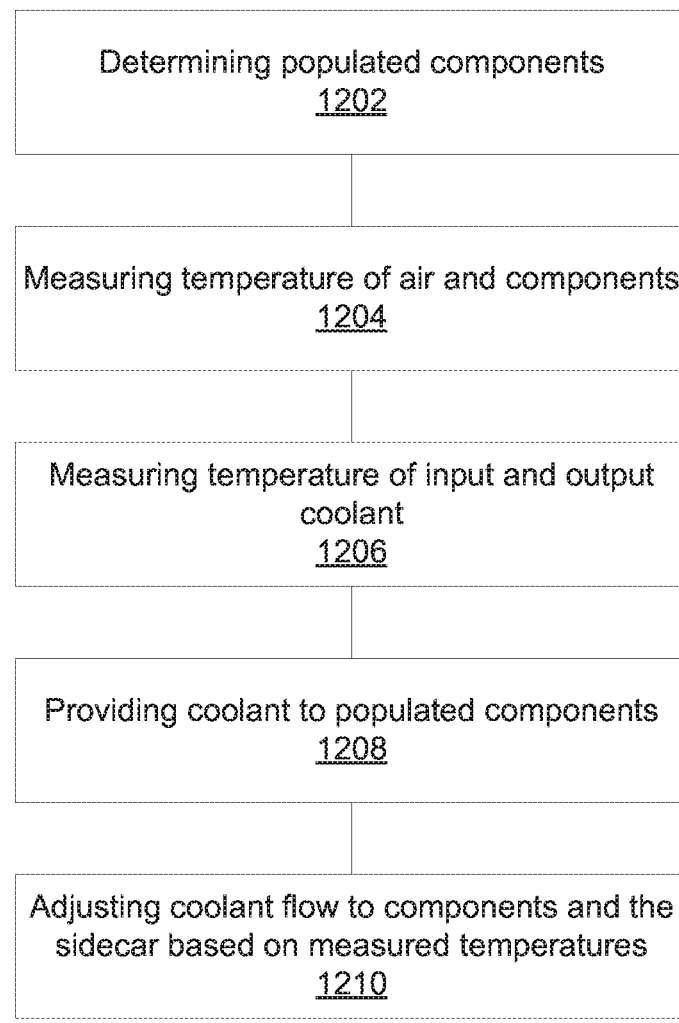
FIG. 12 is a block/flow diagram of a method for tuning intra-server cooling according to the present principles.

Referring now to FIG. 12, a method for tuning cooling at the server level is shown. Block 1202 determines which components in a server 1100 are populated. For example, block 1202 determines which memory slots 1104 are occupied and which CPUs 1102 are active. Block 1204 measures the air temperature and the temperature of components using temperature sensor 1116, while block 1206 measures the input and output coolant temperature. Block 1208 provides coolant to the populated components and turns off coolant flow to those components which are absent or inactive using, e.g., valves 1118. Block 1210 adjusts flow to the components and the sidecar 1110 based on the measured temperatures. Block 1210 may do this by adjusting the valves 1118, by adjusting an overall coolant flow rate into the server 1100, or by a combination of the two.

Having described preferred embodiments of a system and method for provisioning cooling elements for chillerless data centers (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for providing multi-level distributed cooling to a data center, comprising:
    providing a flow of liquid coolant to one or more racks including operating servers in the data center;
    monitoring a liquid coolant temperature before the coolant has entered into one or more racks;
    monitoring ambient temperature information;
    adjusting cooling of the data center in accordance with the ambient temperature information, wherein cooling of the data center is adjusted by decreasing cooling of the liquid coolant if the coolant temperature falls below a first coolant threshold temperature by disengaging one or more liquid-to-liquid heat exchangers; and
    turning on additional servers if the coolant temperature is below the first coolant threshold and all liquid-to-liquid heat exchangers have been disengaged.

2. The method of claim 1, wherein monitoring includes monitoring the coolant temperature after the coolant has exited one or more racks.

3. The method of claim 1, wherein adjusting cooling of the liquid coolant in accordance with the ambient temperature information includes decreasing cooling by shutting off the flow of coolant through one or more liquid-to-liquid heat exchangers to increase the coolant temperature that returns to the racks if the ambient temperature goes below a second threshold.

4. The method of claim 3, wherein decreasing cooling of the liquid coolant comprises disengaging heat rejecters that remove heat from the liquid coolant.

5. The method of claim 3, further comprising selectively cooling one or more liquid-cooled components in each server.

* * * * *